(12) United States Patent
Sharpes et al.

(10) Patent No.: US 6,433,570 B1
(45) Date of Patent: *Aug. 13, 2002

(54) MODULAR DESIGN FOR AN INTEGRATED CIRCUIT TESTING APPARATUS

(75) Inventors: Michael J. Sharpes; Robert L. Totorica, both of Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/703,354

(22) Filed: Oct. 31, 2000

Related U.S. Application Data

(63) Continuation of application No. 09/256,635, filed on Feb. 24, 1999, now Pat. No. 6,140,829, which is a continuation of application No. 08/091,953, filed on Jul. 15, 1993, now Pat. No. 5,880,592.

(51) Int. Cl.$^7$ ............................................... G01R 31/00
(52) U.S. Cl. ....................................... 324/760; 324/765
(58) Field of Search ................................ 324/760, 765, 324/158.1; 219/209; 165/80.3, 80.4; 438/14, 18; 361/696, 697

(56) References Cited

U.S. PATENT DOCUMENTS

| | | | |
|---|---|---|---|
| 3,996,508 A | 12/1976 | Board | 323/6 |
| 4,073,002 A | 2/1978 | Sickles et al. | 361/227 |
| 4,145,620 A | 3/1979 | Dice | 307/149 |
| 4,468,616 A | 8/1984 | Yoshizaki | 324/158 F |
| 4,866,714 A | 9/1989 | Adams et al. | 371/22.1 |
| 4,900,948 A | 2/1990 | Hamilton | 307/149 |
| 5,086,271 A | 2/1992 | Haill et al. | 324/158 |
| 5,103,168 A | 4/1992 | Fuoco | 324/158 F |
| 5,481,432 A | 1/1996 | Tsukada et al. | 361/686 |
| 5,880,592 A | 3/1999 | Sharpes et al. | 324/760 |
| 6,140,829 A | * 10/2000 | Sharpes et al. | 324/760 |

* cited by examiner

*Primary Examiner*—Vinh P. Nguyen

(57) ABSTRACT

A compact and modularly designed apparatus for testing and burning-in semiconductor devices comprises first and second power supplies and the use of direct current (DC) to DC converters. The first power supply provides a high voltage low amperage power source to drive the devices under test (DUTs), and the second power supply supplies 15 volts and 5 volts to drive the circuitry on the testing equipment. The high voltage and low amperage is supplied to slot boards, and the DC to DC converters alter the voltage and current to digital levels. Supplying high voltage and low amperage power through the system to a location electrically near the DUTs, then converting it with DC to DC converters to power the DUTs, allows for much smaller connectors and for a modularly designed burn-in oven.

12 Claims, 5 Drawing Sheets

US 6,433,570 B1

MODULAR DESIGN FOR AN INTEGRATED CIRCUIT TESTING APPARATUS

CONTINUING INFORMATION

This is a continuation of U.S. application Ser. No. 09/256,635 filed Feb. 24, 1999 and issued Oct. 31, 2000 as U.S. Pat. No. 6,140,829, which was a continuation of U.S. application Ser. No. 08/091,953 filed Jul. 15, 1993 and issued Mar. 9, 1999 as U.S. Pat. No. 5,880,592.

FIELD OF THE INVENTION

The present invention relates to integrated circuit devices, and more particularly to burn-in and test equipment used during the manufacture of integrated circuit devices.

BACKGROUND OF THE INVENTION

Operational Life Tests (OLTs) provide measures of the reliability of integrated circuit devices (ICs). An OLT achieves this by continually exercising a component such as an IC, or a plurality of components simultaneously. OLTs also include testing in a chamber having a controlled environment, with instrumentation controlled to simulate use by a customer.

During operational life testing a plurality of semiconductor devices are mounted on burn-in boards which are interconnected for operation in either series or parallel depending on the test to be performed. While the devices are being electrically tested, the temperature within the chamber is cycled to simulate temperature cycling experienced by the devices during normal use. It has been found that with operational life testing infant mortality rates can be determined, which aids in avoiding early failures in the field. Additionally, reliability problems can be dealt with by component "burn-in" which includes testing the devices at increased temperature to induce infant mortality failures at the factory.

The concept of burn-in is a method for screening out early failures in a group of devices prior to their introduction into general service by a customer. The burn-in process involves time as an important factor since the elements to be tested are monitored for failure either continuously or at a predefined time sequence. A goal with respect to burn-in is to provide an adequate burn-in period to detect infant mortals while testing devices no longer than necessary.

The controls of typical burn-in systems are interconnected with large cables from their power supplies. The cables are difficult to connect and contribute to large, heavy equipment. Repairing the equipment can be a complex process because of the complex designs of typical testing and burn-in equipment. Typical testing equipment requires a number of power supplies to test the large number of device under test boards loaded into the environmental chamber (oven).

SUMMARY OF THE INVENTION

A modular semiconductor component testing device comprises an environmental chamber, a circuitry chamber separated from the environmental chamber by an insulated wall, a power supply chamber, a direct current (DC) power supply in the power supply chamber for supplying a first voltage, first amperage power signal or source, and a power bar connected to the power supply which receives the power source from the power supply. The testing device further comprises a zone board electrically connected to the DC power supply through the power bar and receives the power source through the power bar. A slot board is housed in the circuitry chamber and is electrically connected to the zone board. The slot board receives the power source from the zone board and a DC to DC power converter on the slot board lowers the first voltage to a second voltage and raises the first amperage to a second amperage. A device under test (DUT) board is housed in the environmental chamber and is connected through the insulated wall to the slot board and receives the second voltage and amperage from the slot board.

Features and advantages of the present invention will become more clear from the following detailed description of the invention, taken in conjunction with the accompanying drawings and claims, or may be learned by the practice of the invention.

Figure 1:
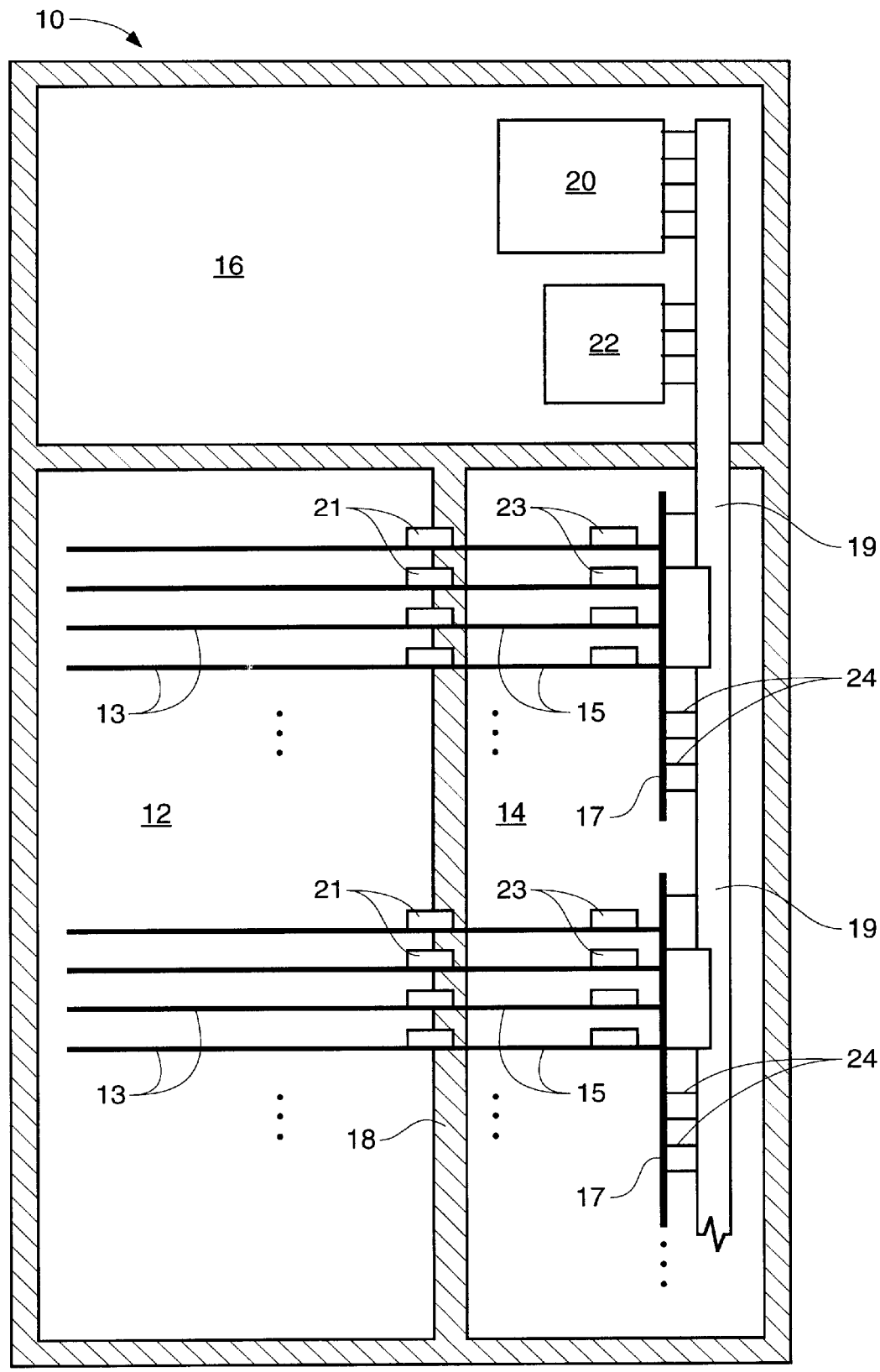
FIG. 1 is a cross section of one embodiment of the inventive testing device.

It is noted that the drawings of the invention are not to scale. The drawings are merely schematic representations and are not intended to portray specific parameters of the invention. The drawings are intended to depict only typical embodiments of the invention, and are therefore not to be considered limiting of its scope. The invention will be described with additional specificity and detail through the use of the accompanying drawings, specification, and appended claims. Additionally, like numbering in the drawings represent like elements within and between drawings.

DETAILED DESCRIPTION OF THE INVENTION

The following U.S. patents are herein incorporated by reference for pertinent and supporting information:

U.S. Pat. No. 5,086,271, is a driver system and distributed transmission line network for driving devices under test. U.S. Pat. No. 4,900,948 is an apparatus providing signals for burn-in of integrated circuits. U.S. Pat. No. 4,866,714, is a personal computer based dynamic burn-in system.

One skilled in IC testing will easily understand the operation of a modular design for an IC testing burn-in oven from this description and the attached drawings.

FIG. 1 comprises the following elements: A modular semiconductor component testing device 10 comprises an oven or environmental chamber 12 for cooling and/or heating components, a circuitry chamber 14, and power supply chamber 16. Device under test (DUT) boards 13 are provided in the environmental chamber during testing, and slot boards 15 are connected to the DUT boards via connectors 21 through the oven wall 18. The slot boards have direct current (DC) to DC converters 23, and are connected to a zone board 17. The zone board is connected to a power bar 19 via connectors 24 which electrically couple power supplies 22 and 20 to the slot, zone, and DUT boards.

Figure 2:
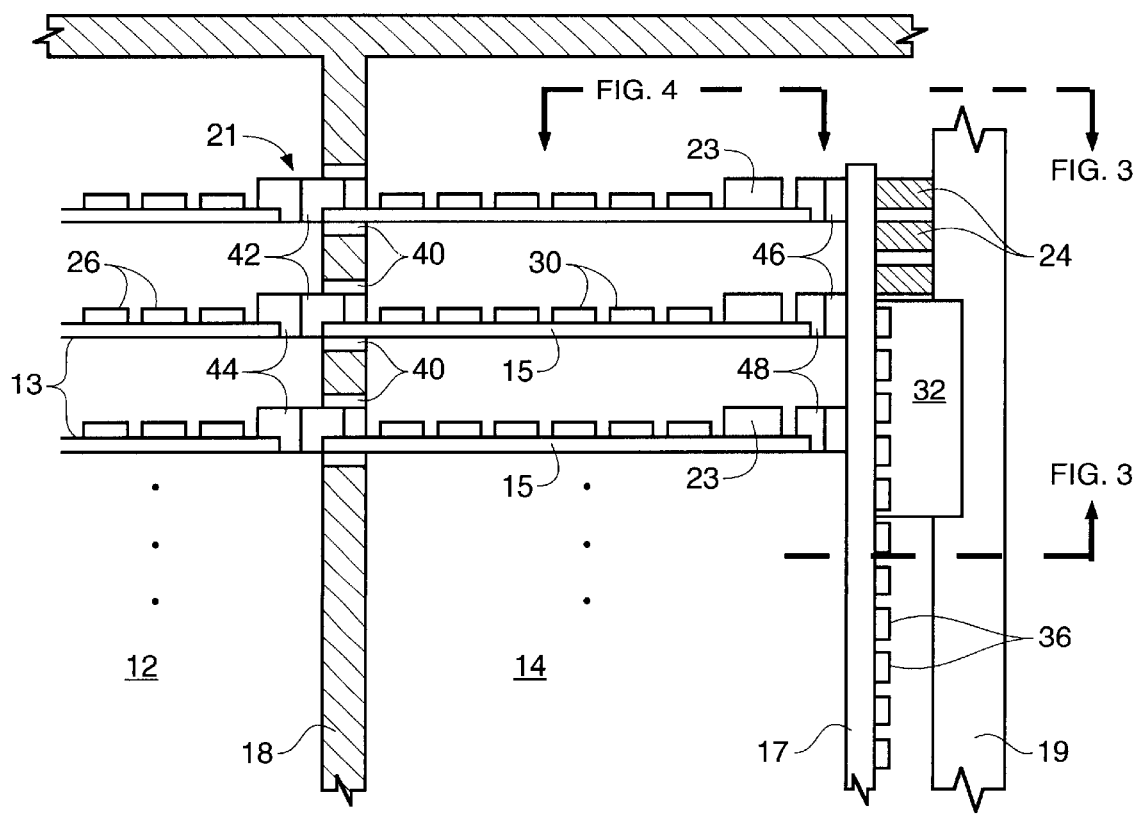
FIG. 2 is a cross section of an environmental chamber and a components chamber.

FIG. 2 comprises the following elements: On DUT boards 13 are illustrated the devices under test 26. The DUT boards 13 are connected to the slot boards 15 via DUT board connector 44 and slot board connector 42, which can be any standard connector. Seals 40 act to pressure-hold the board connectors in place and seal the elevated temperature in the environmental chamber from the circuitry chamber 14. On each slot board is illustrated control circuitry 30, a DC to DC converter 23, and slot board connector 48 joined with zone board connector 46. On the zone board is illustrated a central processing unit (CPU) card 32, and associated circuitry 36. The power bar 19 depicts the connector 24 joined with the zone board 17. It is noted at this time that there are usually eight slot boards along the length of the zone board.

Figure 3:
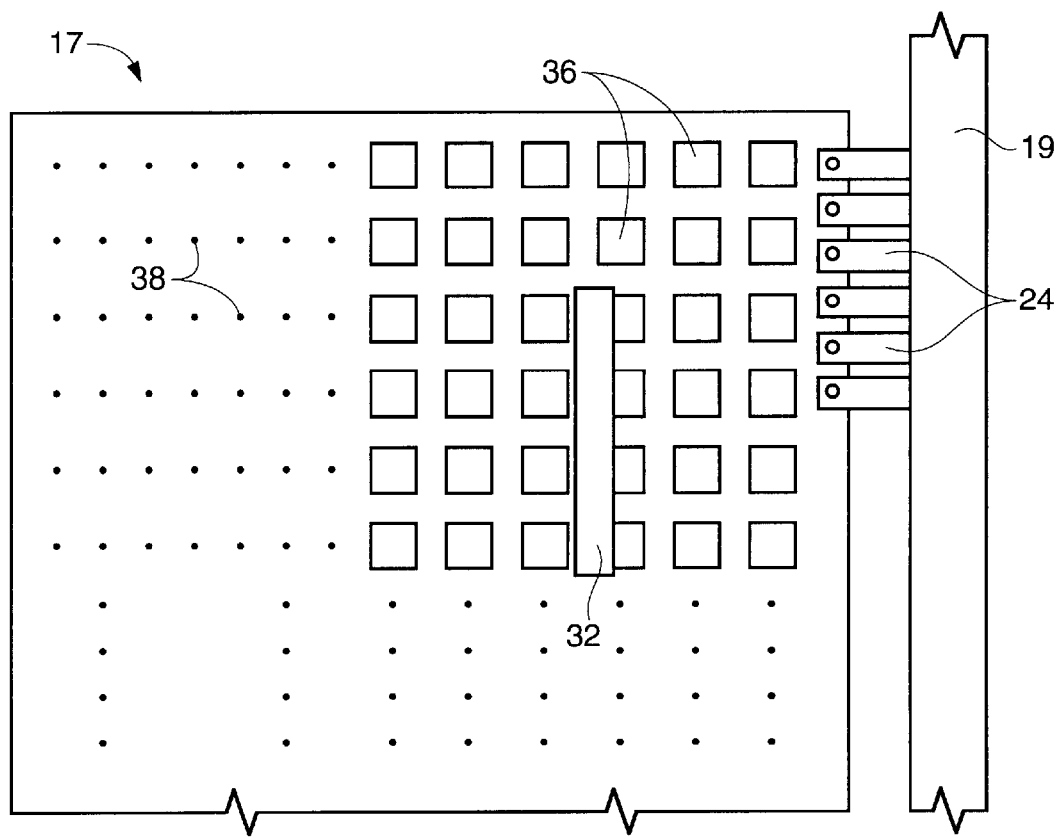
FIG. 3 is a plan view of a zone board and a power bar in one possible embodiment of the invention.

FIG. 3 comprises the following elements: Pin connections 38 from the zone board connector 46 protrude through the zone board 17.

Figure 4:
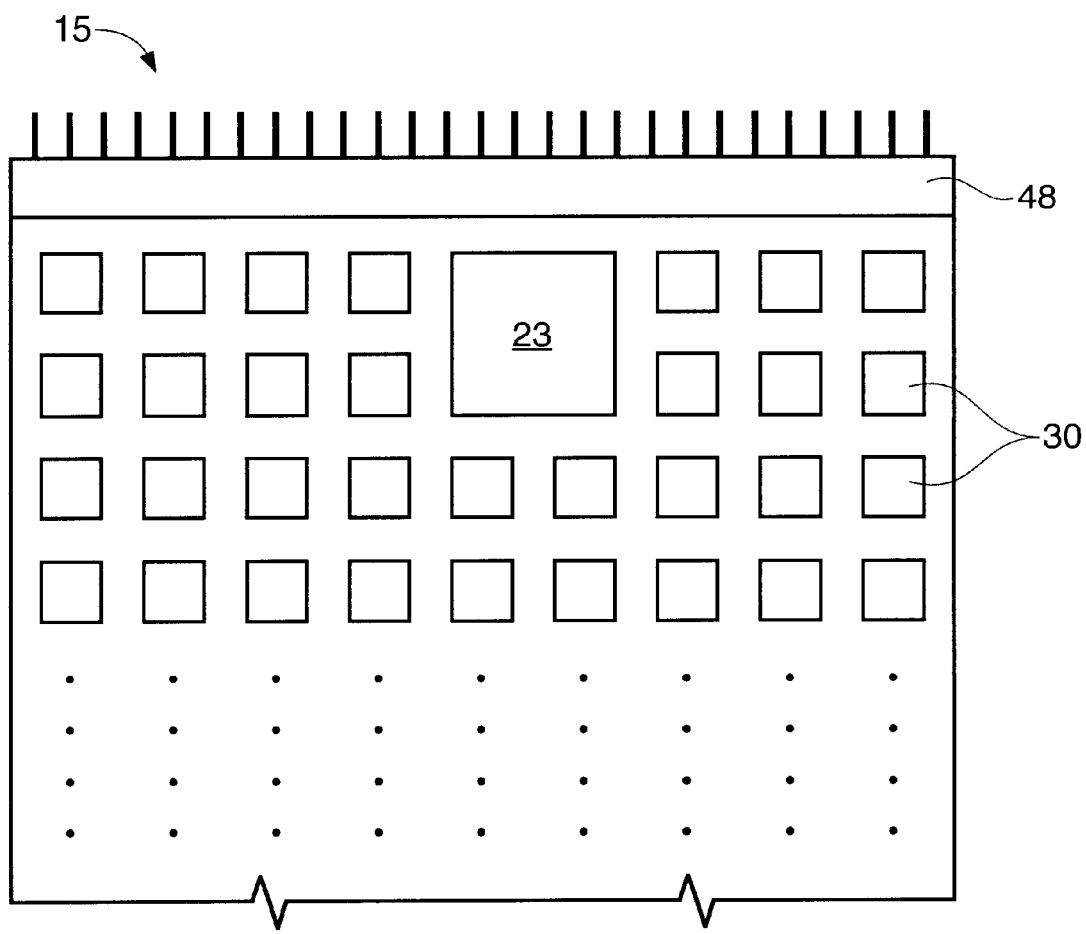
FIG. 4 is a plan view of a slot board.

FIG. 4 illustrates the arrangement of the slot board 15 comprising DC to DC converter 23, slot board connector 48, and control circuitry 30.

Figure 5:
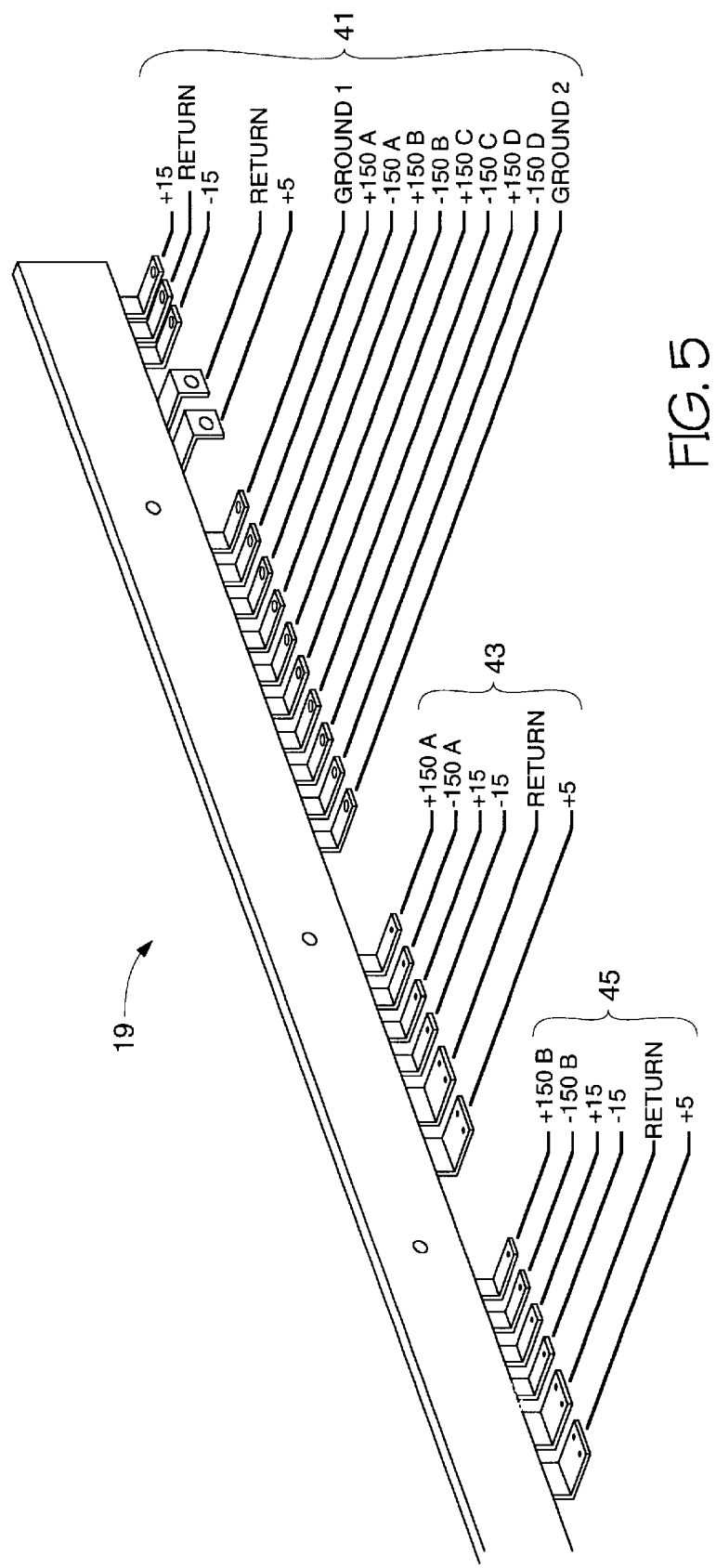
FIG. 5 illustrates a power bar and its possible connections.

FIG. 5 illustrates connector pins along the power bar 19 which interconnect the power supplies and the zone board through the power bar. In particular, element 41 comprises first fifteen pins having the sources as depicted which receive the indicated sources from the power supplies 20, 22. Elements 43 and 45 each comprise a number of pins, with the pins of each element providing power to one zone with each zone having eight slot boards. Note that sources for four zones (zone A, zone B, zone C, and zone D) are depicted in element 41, but sources to supply only two zones (43, 45) are depicted for simplicity. The sources, while not depicted, are repeated for zones C and D.

With reference to FIG. 5, starting with the upper right hand pin depicted are the following pins and functions: +15 volts is received from the power supply 22 to power analog circuits on the zone 17 and slot 15 boards. RETURN is a return path for the ±15 volts, which is commonly used with the 5 volt return. The −15 volts is used to supply power for analog circuits on the zone and slot boards. RETURN is another return path as described. +5 volts also received from power supply 22 is used to power digital circuits on the zone and slot boards. GROUND 1 separates previous low voltage connections from high voltage connections described below. Voltages +150 A and −150 A are received from power supply 20 and combine to provide 300 volts for the DC to DC converter in zone A. This same arrangement is depicted three additional times, once for each of zones B, C, and D. GROUND 2 separates high voltages from the outside layer of the power bar.

Element 43 supplies sources to zone A, and +150 A and −150 A combine to provide a 300 voltage supply. The +15 and −15 pins supply analog circuits on the zone A zone board with ±15 volts. The RETURN pin is a path for zone A +5 volts, +15 volts, and −15 volts. The +5 pin provides digital circuits on the zone A zone and slot boards with +5 volts.

The sources of element 45 provide zone B with the same sources 43 described for zone A.

The ±150 volts are routed to the DC to DC converters on each slot board. The converters lower the voltage and increase the amperage to provide appropriate voltage and amperage for the digital circuitry, for example in the range of 5 volts and 20 amps. These power sources are then routed to the DUT boards to power the devices under test.

The remaining power supply sources, +5 volts, +15 volts, and −15 volts are used by the zone and slot boards for controlling the types of tests, for selection of the DUT board to be tested, and for storing the results of the tests. In the arrangement depicted, the zone boards control the address and data information while the slot board selects the DUT board to be tested and tracks a comparison of data written to each bit location and read from each location.

It is noted that the arrangement of all of the component parts of the system is modular and convenient. If a zone board needs replacement, it is not overly difficult to disconnect the zone board from the slot board and the power bar. Similarly, it is simple to replace any slot board. It should also be noted that insertion of the DUT boards into connector 44 in preparation for burn-in and/or testing of the components is easily accomplished. In the design as depicted there is very little wiring, and snap fitting and screws are used where possible.

There are several variations to the invention and thus come within the scope of the present invention. Uniquely, this invention may work with any number of slot boards attached to zone boards. Any number of zone boards may be used for testing equipment having larger chambers 12,14. Even though only one wall is illustrated as being thick to illustrate the insulation of the environmental chamber from the circuitry chamber, all walls to the oven are insulated to contain the heat in the environmental chamber. There are many types of connections that may be used and purchased over the counter to connect two printed circuit boards together other than the illustrated connectors of 42, 44, 46, and 48.

While the invention has been taught with specific reference to these embodiments, one skilled in the art will recognize that changes can be made in form and detail without departing from the spirit and the scope of the invention. The described embodiments are to be considered as illustrative and not restrictive. The scope of the invention is, therefore, indicated by the appended claims.

What is claimed is:

1. A semiconductor device testing apparatus comprising:
   a first power supply adapted to output a first power signal having a first amperage and a first voltage;
   a second power supply adapted to output a second power signal;
   at least one zone board adapted to receive said second power signal and to output a third power signal;
   at least one slot board adapted to receive said first and third power signals and to convert said first power signal to a fourth power signal having a second amperage lower than said first amperage and a second voltage higher than said first voltage; and
   a plurality of device under test boards each adapted to receive at least one semiconductor device to be tested, and further adapted to receive said fourth power signal.

2. The semiconductor device testing apparatus of claim 1 further comprising:
   a first chamber housing said at least one slot board;
   a second chamber housing said plurality of device under test boards; and
   an insulated wall which thermally insulates said first chamber from said second chamber.

3. The semiconductor device testing apparatus of claim 1 further comprising a plurality of said zone boards each having a central processing unit mounted thereto.

4. The semiconductor device testing apparatus of claim 1 further comprising a plurality of said slot boards each having a direct current (DC) to DC converter mounted thereto, wherein said DC to DC converter is adapted to receive said first power signal and to convert said first power signal to said fourth power signal.

5. A semiconductor device testing apparatus comprising:
   a first chamber comprising at least one power supply;
   a second chamber comprising a plurality of zone boards each electrically coupled with said power supply and further comprising a plurality of slot boards electrically coupled with each said zone board and with said power supply; and a third chamber comprising a plurality of device under test boards each adapted to receive a plurality of semiconductor devices to be tested, wherein each device under test board is electrically coupled with one of said slot boards and with said power supply.

6. The semiconductor device testing apparatus of claim 5 further comprising a seal interposed between said second and third chambers adapted to thermally insulate said second chamber from said third chamber.

7. The semiconductor device testing apparatus of claim 5 wherein said testing apparatus is adapted to alter a temperature within said third chamber away from ambient.

8. The semiconductor device testing apparatus of claim 5 wherein said testing apparatus is adapted to heat and burn in semiconductor devices mounted to said device under test boards.

9. The semiconductor device testing apparatus of claim 5 wherein said testing apparatus is adapted to cool semiconductor devices mounted to said device under test boards.

10. The semiconductor device testing apparatus of claim 5 further comprising a power bar electrically coupled with said at least one power supply and with said plurality of zone boards.

11. The semiconductor device testing apparatus of claim 5 further comprising a plurality of direct current (DC) to DC converters wherein each slot board comprises one of said DC to DC converters.

12. The semiconductor device testing apparatus of claim 5 further comprising each device under test board being electrically coupled with said power supply by power passed from one of said slot boards through a connector.

* * * * *